United States Patent [19]

Elsner et al.

[11] Patent Number: 5,436,467
[45] Date of Patent: Jul. 25, 1995

[54] SUPERLATTICE QUANTUM WELL THERMOELECTRIC MATERIAL

[76] Inventors: Norbert B. Elsner, 5656 Soledad Rd.; Saeid Ghamaty, 7922 Ave. Kirjah, both of La Jolla, Calif. 92037

[21] Appl. No.: 185,562

[22] Filed: Jan. 24, 1994

[51] Int. Cl.$^6$ ............ H01L 27/12; H01L 35/28; H01L 29/161; F25B 21/02
[52] U.S. Cl. ............ 257/15; 257/616; 257/930; 62/3.2; 136/203
[58] Field of Search ............ 257/613, 614, 616, 625, 257/930, 15; 62/3.2; 136/203

[56] References Cited

U.S. PATENT DOCUMENTS

| | | | |
|---|---|---|---|
| 3,780,425 | 12/1973 | Penn et al. | 257/930 |
| 4,835,059 | 5/1989 | Kodato | 257/930 |

FOREIGN PATENT DOCUMENTS

| | | | |
|---|---|---|---|
| 2-178958 | 7/1990 | Japan | 257/930 |
| 4-099075 | 3/1992 | Japan. | |
| 5-226579 | 9/1993 | Japan. | |

*Primary Examiner*—Mahshid D. Saadat
*Attorney, Agent, or Firm*—John R. Ross

[57] ABSTRACT

A multi-layer superlattice quantum well thermoelectric material using materials for the layers having the same crystalline structure. A preferred embodiment is a superlattice of Si and SiGe, both of which have a cubic structure. Another preferred embodiment is a superlattice of B-C alloys, the layers of which would be different stoichometric forms of B-C but in all cases the crystalline structure would be alpha rhombohedral.

10 Claims, 2 Drawing Sheets

SUPERLATTICE QUANTUM WELL THERMOELECTRIC MATERIAL

This invention relates to thermoelectric devices and in particular to materials for such devices.

BACKGROUND OF THE INVENTION

Thermoelectric cooling and heating has been known for many years; however, its use has not been cost competitive except for limited applications because of the lack of thermoelectric materials having the needed thermoelectric properties.

A good thermoelectric material is measured by its "figure of merit" or Z, defined as $$Z = S^2/\rho K$$

where S is the Seebeck coefficient, $\rho$ is the electrical resistivity, and K is the thermal conductivity. The Seebeck coefficient is further defined as the ratio of the open-circuit voltage to the temperature difference between the hot and cold junctions of a circuit exhibiting the Seebeck effect, or $$S = V/(T_h - T_c).$$

Therefore, in searching for a good thermoelectric material, we look for materials with large values of S, and low values of $\rho 0$ and K.

Thermoelectric materials currently in use today include the materials listed below with their figures of merit shown:

| Thermoelectric Material | Peak Zeta, Z (at temperature shown) | ZT |
|---|---|---|
| Lead telluride | $0.9 \times 10^{-3}$/°K. at 500° K. | 0.9 |
| Bismuth telluride | $3.2 \times 10^{-3}$/°K. at 300° K. | 1.0 |
| Silicon germanium | $0.8 \times 10^{-3}$/°K. at 1100° K. | 0.9 |

Workers in the thermoelectric have been attempting too improve the figure of merit for the past 20–30 years with not much success. Most of the effort has been directed to reducing the lattice thermal conductivity (K) without adversely affecting the electrical conductivity. Experiments with superlattice quantum well materials have been underway for several years. These materials were discussed in an paper by Gottfried H. Dohler which was published in the November 1983 issue of Scientific American. This article presents an excellent discussion of the theory of enhanced electric conduction in superlattices. These superlattices contain alternating conducting and barrier layers. These superlattice quantum well materials are crystals grown by depositing semiconductors in layers whose thicknesses is in the range of a few to up to about 100 angstroms. Thus, each layer is only a few atoms thick. There has been speculation that these materials might be useful as thermoelectric materials. (See articles by Hicks, et al and Harman published in Proceedings of 1992 1st National Thermoelectric Cooler Conference Center for Night Vision & Electro Optics, U.S. Army, Fort Belvoir, Va. FIG. 1 has been extracted from the Hicks paper and is included herein as prior art. It projects theoretically very high ZT values as the layers are made progressively thinner.) The idea being that these materials might provide very great increases in electric conductivity without adversely affecting Seebeck coefficient or the thermal conductivity. Harmon of Lincoln Labs, operated by MIT has claimed to have produced a superlattice of layers of (Bi,Sb) and Pb(Te,Se). He claims that his preliminary measurements suggests ZTs of 3 to 4. However, the present inventors have demonstrated that high ZT values can definitely be achieved with Si/Si$_{0.8}$Ge$_{0.2}$ superlattice quantum wells. Most of the efforts to date with superlattices have involved alloys which are known to be good thermoelectric materials for cooling, many of which are difficult to manufacture as superlattices because the stoichiometry of the alloys have to be very carefully controlled which is very difficult in vapor deposition techniques such as molecular beam epitaxy.

What is needed are thermoelectric materials with improved ZT values which permit a simplified manufacturing process.

SUMMARY OF THE INVENTION

The present invention provides a superlattice quantum well thermoelectric material using elements for the layers all of which have the same crystalline structure. This makes the vapor disposition process easy because the exact ratio of the materials in the quantum well layers is not critical. The inventors have demonstrated that materials produced in accordance with this invention provide figures of merit more than six times that of prior art thermoelectric materials. A preferred embodiment is a superlattice of Si, as the barrier material, and SiGe, as the conducting material, both of which have the same cubic structure. Another preferred embodiment is a superlattice of B-C alloys, the layers of which would be different stoichiometric forms of B-C but in all cases the crystalline structure would be alpha rhombohedral.

DETAILED DESCRIPTION OF PREFERRED EMBODIMENTS

The present inventor has demonstrated that a a revolutionary thermoelectric material, with ZT values in excess of 6. This material is a superlattice material of very thin layers of silicon and silicon germanium. The principal advantage of this superlattice over many others that have been suggested is that Si and Ge both have the same crystalline structure so that when the layers are grown the atoms fit together to form the superlattices.

Making the n-Type Superlattice

Si$_{0.8}$Ge$_{0.2}$/Si layers were grown on (100) Si substrates by codeposition from two electron beam evaporation sources in a molecular beam epitaxy. The fluxes from the Si and Ge electron beam sources were separated, sensed and controlled to yield a total deposition rate of 5 A/sec. Prior to deposition, substrates were chemically cleaned, then argon sputtered in situ and annealed at 800°–850° C. Above 500° C., annealing and growth temperatures were measured directly by infrared pyrometry.

tested thermoelectric properties of samples of $Si_{0.8}Ge_{0.2}/Si$ are compared in Table I with the properties of bulk material with the same ratios of Si and Ge:

TABLE I

| Sample $Si_{.8}Ge_{.2}/Si$ | Electrical Resitivity $\rho$ (m$\Omega$-cm) | Seebeck Coef. $\alpha$ ($\mu$V/°C) | Carrier Conc. n (1/cm) | Band Gap Eg (eV) | Power Factor $\alpha^2/\rho$ ((/1000)) | Figure of Merit Z | Z(Abs Temp) (T = 300° K.) ZT |
|---|---|---|---|---|---|---|---|
| Superlattice Quantum Well | 0.26 | −260 | $10^{16}$ | 1.25 | 260 | $5 \times 10^{-3}$ | 1.5 |
| Bulk | 1 | −130 | $10^{20}$ | 1.05 | 17 | $.33 \times 10^{-3}$ | 0.1 |

Then the layers could be alternatively deposited on top of each other to make $Si_{0.8}Ge_{0.2}/Si$ superlattices with each layer being about 50 A thick.

Figure 1:
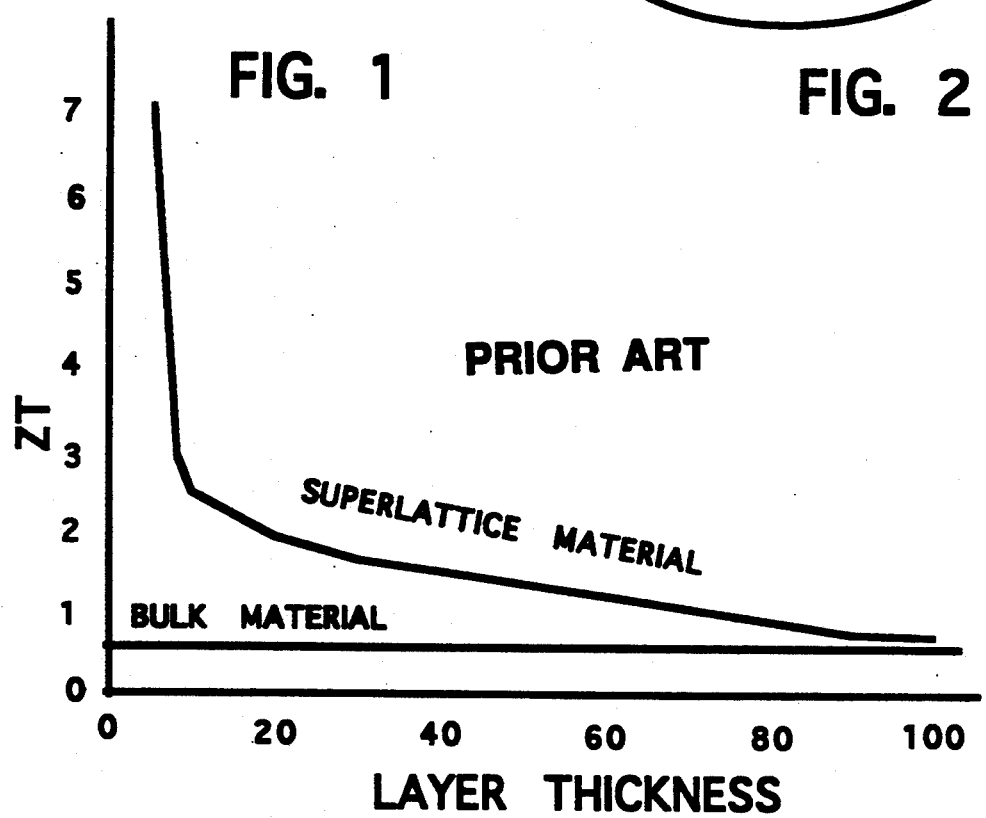
FIG. 1 is a graph showing the theoretical thermoelectric properties of superlattice materials.

The actual deposition configuration is illustrated schematically in FIG. 1. Five substrates 2 are mounted on the bottom of platen 4 which rotates at a rate of 1 revolution per second. The platen is 50 cm in diameter and the substrate wafers are each 125 mm in diameter. Two deposition sources 6 and 8 are mounted on a source flange 7 such that their deposition charges are about 20 cm from the axis 5. Deposition source 6 is pure silicon and deposition source 8 is a germanium doped to ~$10^{16}$ carriers per cc. The rotating platen is positioned 23 cm above the sources. An Airco Temescal electron beam is used for evaporation. We use one 150 cc source of pure silicon and a 40 cc source of germanium. We alternate the beams so layers of silicon only and silicon and germanium are deposited. Dopants may be mixed with the germanium.

Figure 2:
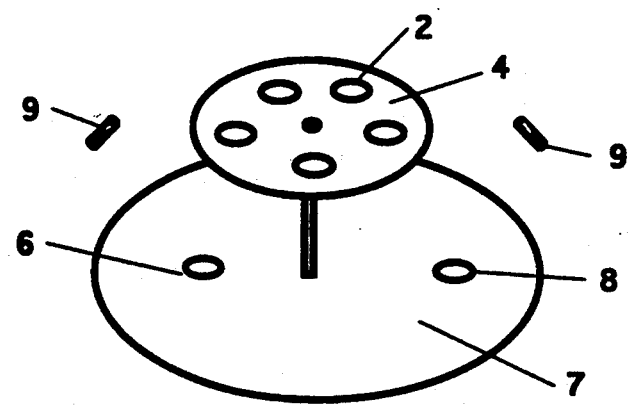
FIG. 2 is simple drawing showing an apparatus for making superlattice materials.

The apparatus is computer controlled to evaporate the sources alternatively at intervals appropriate to achieve the desired thicknesses while the platen rotates above. Layer thicknesses are monitored by two electroluminescent deposition meters 9 at the side of platen 4. Layers will continue to build on the substrates until we have a wafer with about 250,000 layers and a thickness of about 0.254 cm. which is the thickness needed for a preferred thermoelectric device. The wafer is then diced into chips as indicated in FIG. 2.

Making the p-Type Material

We make the p-type material exactly as discussed above except we use a p-type dope for the SiGe layers. These layers are boron doped with $10^{16}$ carriers per cc.

Making the Thermoelectric Element

Figure 3:
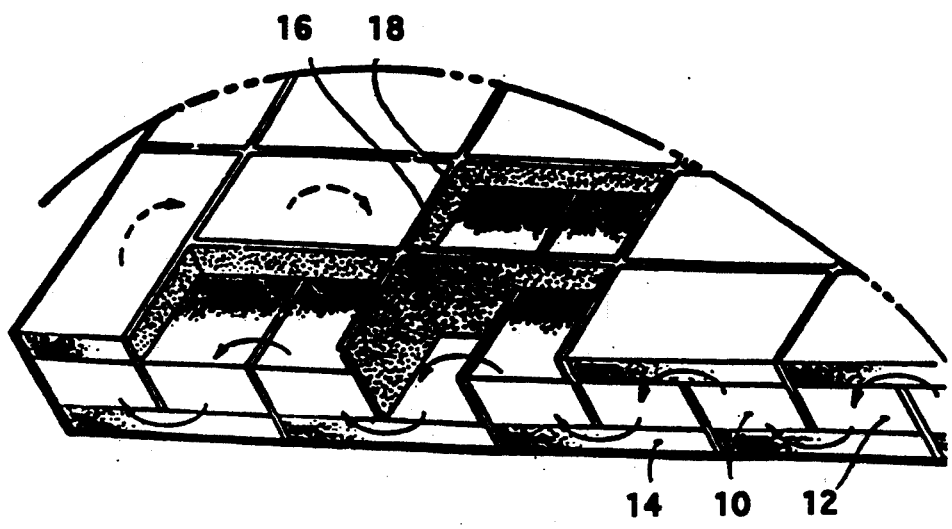
FIG. 3 shows a thermoelectric eggcrate arrangement.
Figure 4:
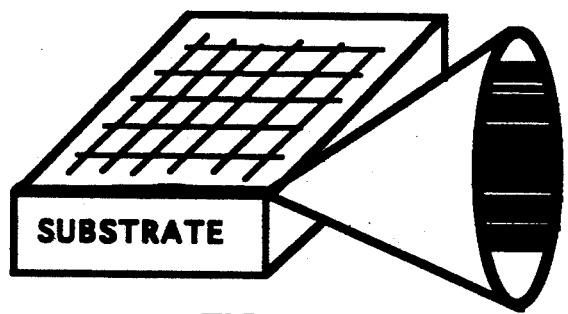
FIG. 4 shows how the thermoelectric elements are cut from the substrate on which grown.
Figure 5:
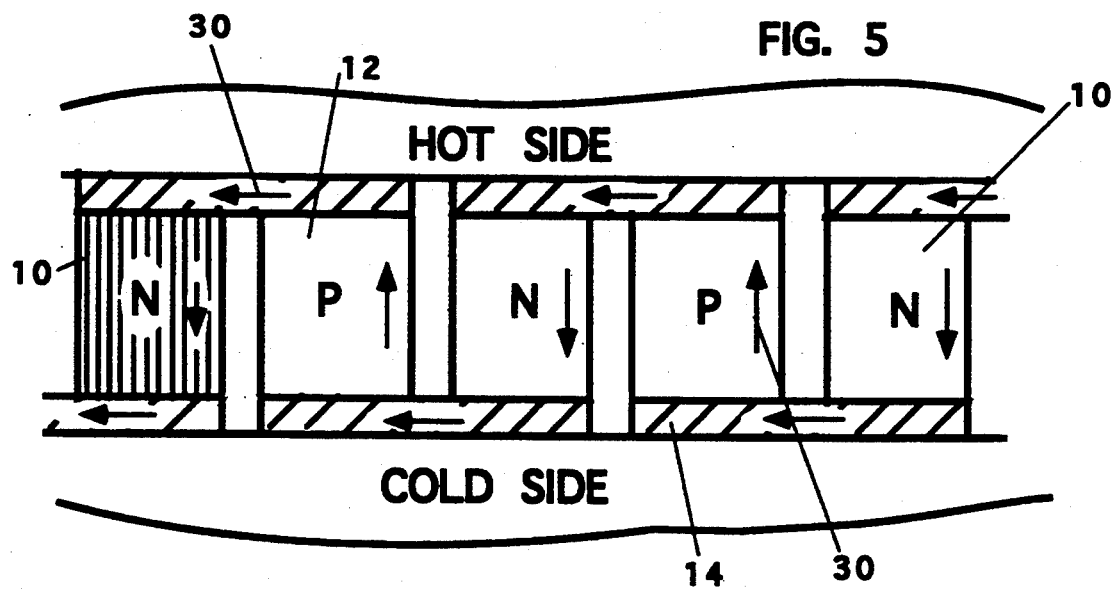
FIG. 5 shows a portion of a thermoelectric device to show current flow through the elements.

The p-type and the n-type chips are formed into an egg crate configuration in a manner standard in the industry. Metal contacts are applied then all n and p legs are electrically shorted. The n and p couples are electrically isolated by lapping the surface until the insulating egg crate is visible and a series circuit of n and p elements is produced. In FIG. 3 elements shown are n-type thermoelectric elements 10, p-type thermoelectric elements 12, aluminum electrical connectors 14, eggcrate electrical barrier 16 and molybdenum diffusion barrier 18. FIG. 4 shows how the chips are cut from the silicon substrate. FIG. 5 is another view showing how the n elements 10 and p elements 12 are connected to produce electric power from hot and cold sources. Arrows 30 show current flow. Insulators are shown as 22 and electrical conductors are shown as 14.

Test Results

Materials produced in accordance with the teachings of this invention have been tested by the inventors. The The band gap ($E_g$) for this $Si/Si_{0.8}Ge_{0.2}$ multilayer quantum well was determined to be 1.25 eV. This value demonstrated that a quantum well was formed with Si and $Si_{0.8}Ge_{0.2}$ materials because the band gap of Si is 1.1 and the band gap of the $Si_{0.8}Ge_{0.2}$ alloy is 1.05 eV. The ZT of the $Si/Si_{0.8}Ge_{0.2}$ material at room temperature is about 1.5. At higher temperature, such as 500° C., the ZT would be approximately 2.5 and at 1000° C. the ZT would be 6.5, providing Z remained constant with temperature.

Similar High Temperature Lattices

The Si/SiGe superlattice is not stable at very high temperatures for very long periods (i.e., above about 500° C.); therefore, there is a need for a similar superlattice which can be operated at these high temperatures. Boron and Boron-Carbon alloys are also expected to perform as excellent P type quantum well materials. The same alpha rhombohedral crystal structure exists over a wide range of composition from $B_4C$ to $B_{11}C$. As the B content is increased in going from $B_4C$ to $B_{11}C$ the B atoms substitute for C atoms. As a result of this progressive change in composition without a change in structure it should be possible to grow eptaxial layers of various B-C compositions on one another. From data generated on bulk B-C alloys one should be able to fabricate a quantum well device by using compositions close to $B_{11}C$ as the insulating layer and compositions close to $B_4C$ as the more conducting layer that is the quantum well. Also pure alpha boron which is rhombohedral could be used as the insulating layer. The B-C alloys are of further interest because these alloys exhibit extremely low diffusion rates at temperatures at which they would be used as thermoelectric materials. For example, the B-C alloys of interest melt at temperatures in excess of 2400° C. yet they will only be operated up to about 1100° C. By using materials such as B-C alloys the quantum well layers will remain intact at elevated temperatures and not be subject to degradation by adjacent layers diffusing together with time. This annihilation of the two adjacent layers via diffusion is of serious concern with the lower melting alloys such as Si/SiGe, PbTe based alloys, and $(Bi,Sb)_2(Se,Te)_3$ based alloys and limits their usefulness in high temperature applications.

While the above description contains many specificities, the reader should not construe these as limitations on the scope of the invention, but merely as exemplifications of preferred embodiments thereof. For example, the SiGe ratio could be any composition between about 5 percent Ge to about 95 percent Ge; however, the preferred composition is between about 10 percent Ge and about 40 percent Ge. Those skilled in the art will envision many other possible variations are within its scope. Accordingly the reader is requested to determine the scope of the invention by the appended claims and their legal equivalents, and not by the examples which have been given.

I claim:

1. A thermoelectric material comprised of:
   a plurality of alternating layers of at least two different semiconducting materials, one of said material defining a barrier material and another of said materials defining a conducting material,
   said barrier material and said conducting material having the same crystalline structure,
   said barrier material and said conducting material having band gaps, the band gap of said barrier material being higher than the band gap of said conducting material,
   said conducting material being doped to create conducting properties,
   said layer arrangement of said at least two different materials creating a superlattice and quantum wells within said layers of said conducting material.

2. A thermoelectric material as in claim 1 wherein said crystal structure is cubic.

3. A thermoelectric material as in claim 2 wherein said barrier material is silicon and said conducting material is silicon germanium.

4. A thermoelectric material as in claim 3 wherein the concentration of germanium in said conducting material is between 10 percent and 40 percent.

5. A thermoelectric material as in claim 4 wherein said conducting material is doped with phosphorous.

6. A thermoelectric material as in claim 4 wherein said conducting material is doped with boron.

7. A thermoelectric material as in claim 1 wherein said crystal structure is alpha rhombohedral.

8. A thermoelectric material as in claim 4 wherein at least one of said two different materials is an alloy of boron and carbon.

9. A thermoelectric material as in claim 1 wherein at least two of said at least two different materials are both alloys of boron and carbon.

10. A thermoelectric material comprised of:
    at least 100 alternating layers of at least two different semiconducting materials, one of said materials defining a barrier material and another of said materials defining a conducting material, each layer of at least 50 layers of said conducting material being less than 100 Å thick,
    said barrier material and said conducting material having the same crystalline structure,
    said barrier material and said conducting material having band gaps, the band gap of said barrier material being higher than the band gap of said conducting material,
    said conducting material being doped to create conducting properties,
    said layer arrangement of said at least two different materials creating a superlattice and quantum wells within said layers of said conducting material.

* * * * *